United States Patent
Tanaka et al.

(10) Patent No.: US 8,710,621 B2
(45) Date of Patent: Apr. 29, 2014

(54) BIPOLAR TRANSISTOR WITH DIFFUSED LAYER BETWEEN DEEP TRENCH SIDEWALL AND COLLECTOR DIFFUSED LAYER

(71) Applicant: Panasonic Corporation, Osaka (JP)

(72) Inventors: Mitsuo Tanaka, Fukui (JP); Tsuneichiro Sano, Hyogo (JP); Osamu Matsui, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/725,163

(22) Filed: Dec. 21, 2012

(65) Prior Publication Data

US 2013/0134550 A1    May 30, 2013

Related U.S. Application Data

(63) Continuation of application No. PCT/JP2011/003560, filed on Jun. 22, 2011.

(30) Foreign Application Priority Data

Jul. 21, 2010    (JP) ................................ 2010-164368

(51) Int. Cl.
     *H01L 29/735*      (2006.01)
(52) U.S. Cl.
     USPC ......................................................... 257/526
(58) Field of Classification Search
     CPC ............ H01L 29/735; H01L 21/76237; H01L 29/0821; H01L 29/66272; H01L 29/7322
     See application file for complete search history.

(56) References Cited

U.S. PATENT DOCUMENTS

| | | | |
|---|---|---|---|
| H204 H | 2/1987 | Oh et al. | |
| 5,108,783 A | 4/1992 | Tanigawa et al. | |
| 6,875,663 B2 | 4/2005 | Iwamatsu et al. | |
| 7,183,167 B2 | 2/2007 | Iwamatsu et al. | |
| 7,494,883 B2 | 2/2009 | Iwamatsu et al. | |
| 2003/0119245 A1 | 6/2003 | Iwamatsu et al. | |
| 2005/0101091 A1 | 5/2005 | Iwamatsu et al. | |
| 2007/0032001 A1 | 2/2007 | Iwamatsu et al. | |
| 2009/0026542 A1 * | 1/2009 | Wahl ............................ | 257/350 |

FOREIGN PATENT DOCUMENTS

| | | |
|---|---|---|
| JP | 60-241230 A | 11/1985 |
| JP | 61-133623 A | 6/1986 |
| JP | 62-279666 A | 12/1987 |
| JP | 02-170551 A | 7/1990 |
| JP | 02-283028 A | 11/1990 |
| JP | 04-061346 A | 2/1992 |
| JP | 06-151442 A | 5/1994 |
| JP | 07-263371 A | 10/1995 |
| JP | 2003-188250 A | 7/2003 |

OTHER PUBLICATIONS

International Search Report mailed Sep. 20, 2011 issued in corresponding International Application No. PCT/JP2011/003560.

* cited by examiner

*Primary Examiner* — Walter H Swanson
(74) *Attorney, Agent, or Firm* — McDermott Will & Emery LLP

(57) ABSTRACT

A semiconductor device according to the present invention includes a p-type semiconductor substrate, a first n-type collector diffusion layer formed in the p-type semiconductor substrate, a deep trench formed in the p-type semiconductor substrate so as to surround the first n-type collector diffusion layer, a p-type channel stopper layer formed beneath the deep trench, and an n-type diffusion layer formed between a sidewall of the deep trench and the first n-type collector diffusion layer.

6 Claims, 8 Drawing Sheets

B ion implantation

As ion implantation

Trench region 11b: $\theta tx \geq \tan^{-1}[(W/\cos\theta r)/(t+d)]$

Trench region 11c: $\theta ty \geq \tan^{-1}[(W/\sin\theta r)/(t+d)]$

PRIOR ART

Electrical potential of in-trench polysilicon film 342

BIPOLAR TRANSISTOR WITH DIFFUSED LAYER BETWEEN DEEP TRENCH SIDEWALL AND COLLECTOR DIFFUSED LAYER

CROSS REFERENCE TO RELATED APPLICATIONS

This is a continuation application of PCT Patent Application No. PCT/JP2011/003560 filed on Jun. 22, 2011, designating the United States of America, which is based on and claims priority of Japanese Patent Application No. 2010-164368 filed on Jul. 21, 2010. The entire disclosures of the above-identified applications, including the specifications, drawings and claims are incorporated herein by reference in their entirety.

TECHNICAL FIELD

The present invention relates to semiconductor devices and methods of manufacturing the same, and particularly to a high-performance and low-cost bipolar transistor used in a semiconductor integrated circuit and a method of manufacturing the same.

BACKGROUND ART

In recent years, along with increased integration and increased functionality of semiconductor integrated circuits, enhancement in performance of analog-digital mixed-signal integration circuits on which analog signal processing circuits (analog circuits) and digital signal processing circuits (digital circuits) are integrated has become extremely important.

In a usual design method for the digital circuits, Complementary Metal Oxide Semiconductors (CMOS) including MOS transistors are used aiming for larger scale and lower power consumption. Accordingly, use of the MOS transistors is increasing for the analog circuits, too.

However, a MOS transistor has a drawback in that gm (mutual conductance) is low compared to a bipolar transistor. Therefore, compared to an analog circuit using the bipolar transistor, an analog circuit using the MOS transistor has a reduced gain (amplification rate of a signal) in the analog circuit, and current in the circuit increases when the same amount of gain as that in the case of using the bipolar transistor is obtained.

Moreover, in the case where the MOS transistor is used, the current flowing between the source and the drain flows on the surface of a semiconductor substrate and is, therefore, easily influenced by a crystal lattice defect which exists on the surface of the semiconductor substrate. As a result, in this case, flicker noise characteristics (also referred to as 1/f noise characteristics) deteriorate compared to the case where the bipolar transistor is used.

Moreover, in comparison between mismatch characteristics (the difference in threshold voltages in a pair transistor) which are important in the analog circuit, the characteristics of the MOS transistor are inferior to the characteristics of the bipolar transistor. In the case of the MOS transistor, the difference in threshold voltages of a pair transistor (hereinafter denoted by ΔVth) is influenced by many factors such as variation in the size of a gate electrode, variation in the thickness of a gate insulating film, variation in a concentration in a well surface, and variation in a dopant concentration in a gate polysilicon electrode. On the other hand, in the case of the bipolar transistor, the difference in threshold voltages of a pair transistor (hereinafter denoted by ΔVbe) depends on variation in the area of a junction between the emitter and the base and variation in a dopant concentration between the emitter and the base, so that ΔVbe is smaller than ΔVth.

Accordingly, it is understood that use of the bipolar transistor is more advantageous than use of the MOS transistor in order to increase the performance of the analog circuit (for decreasing power consumption, noise, variation, and others).

However, as described as above, the CMOS is used in the digital circuit. If the bipolar transistor is to be embedded in the digital circuit, a bipolar transistor process becomes necessary in addition to the CMOS process, which causes problems such as increased cost due to an increase in the number of steps for the process, and deterioration of the characteristics of the MOS transistor due to the addition of thermal treatment and processes for forming the bipolar transistor. Moreover, since the area of the bipolar transistor is larger than that of the MOS transistor, there is a problem of an increase in cost due to an increase in the area of a chip.

Conventionally, as a method of decreasing the area of the bipolar transistor, a technique has been proposed which significantly decreases the area of an isolation region between adjacent devices by forming a trench in the isolation region (hereinafter referred to as a trench isolation structure). As for the technique of the trench isolation structure, Patent Literature (PTL) 1 discloses a doping method with regard to a transistor having the trench isolation structure. This method can decrease the area of the isolation region, as well as improving electrical isolation between the adjacent devices. Hereafter, the doping method with regard to the transistor having the trench isolation structure disclosed in PTL 1 will be described with reference to FIG. 6. FIG. 6 shows a cross-sectional view showing processes of the doping method with regard to the transistor having the trench isolation structure disclosed in PTL 1.

First, as shown in (a) in FIG. 6, an entire surface of a p-type substrate 201 is oxidized to form a silicon dioxide layer 202, and a silicon nitride layer 203 and a silicon dioxide layer 204 are sequentially deposited on the silicon dioxide layer 202. Here, the silicon dioxide layer 204 is a film formed by decomposing tetraethyl orthosilicate (hereinafter referred to as "TEOS").

Next, as shown in (b) in FIG. 6, by etching the silicon dioxide layer 202, the silicon nitride layer 203, and the silicon dioxide layer 204, a window 210 (the width is approximately 1 µm) defined by vertical sidewalls 211 and a horizontal bottom face 212 is formed.

Next, as shown in (c) in FIG. 6, boron ion implantation is performed to the p-type substrate 201 from the window 210 using boron as a p-type dopant. The boron ion implantation is successively performed twice; the first ion implantation is performed to reach a depth of 150 nm as indicated by the dotted line A in the diagram, and the second implantation is performed to reach a depth of 400 nm as indicated by the dotted line B in the diagram. Subsequently, desired thermal treatment is performed so that a sufficient dopant concentration can be obtained along the sidewalls of the isolation trench.

Next, as shown in (d) in FIG. 6, the opening of the window 210 is covered by a TEOS layer 205. Subsequently, anisotropic dry etching is performed to the TEOS layer 205 such that only a portion that is deposited on the sidewalls 211 of the window 210 remains in the TEOS layer 205. With this, as shown in (e) in FIG. 6, a TEOS edge portion 205a is formed and the width of the window 210 is decreased. At this time, the sidewalls 211 are positioned apart from the ends of the narrowed window 210 by a distance y. In other words, the width of the window 210 is narrowed by 2y. Here, the value y depends on the thickness of the TEOS layer 205. If the TEOS edge portion 205a is not present, the isolation trench is formed within the range between vertical lines 221 and 222 in (e) in FIG. 6. However, by forming the TEOS edge portion 205a, the isolation trench is formed narrower and the sidewalls of the isolation trench are positioned along vertical lines 223 and 224. Accordingly, the TEOS edge portion 205a is formed to narrow the window 210, so that much highly-concentrated boron can be implanted into the sidewalls of the isolation trench. That is, an amount of the deposited TEOS (the size of the edge portion 205a) controls the dopant concentration in the sidewalls.

Next, as shown in (f) in FIG. 6, by etching the p-type substrate 201 to a depth of approximately 600 nm using the anisotropic dry etching, an isolation trench 230 defined by sidewalls 231 and a bottom portion 232 is formed. Following the anisotropic dry etching, the TEOS layer 204 and the TEOS edge portion 205a are completely removed by etching using buffered hydrofluoric acid. At this time, $p^+$-type regions 241 and 242 are formed at sidewall portions of the isolation trench 230.

Next, as shown in (g) in FIG. 6, by oxidizing the surface of the isolation trench 230, a silicon dioxide layer 250 that is as thin as 100 nm is formed on the surface of the isolation trench 230. Subsequently, boron ion implantation is performed again to increase the boron concentration at the bottom portion of the isolation trench 230 for the purpose of preventing an inversion layer from being formed in the region.

Next, as shown in (h) in FIG. 6, an insulating material 260 is uniformly deposited on the entire surface of a wafer so as to fill the isolation trench 230. This not only fills the isolation trench 230 but forms a flat surface.

Next, as shown in (i) in FIG. 6, anisotropic dry etching is performed until the silicon nitride layer 203 is exposed, and then the silicon nitride layer 203 is removed by etching using hot phosphoric acid. As a result, uniformed structure is obtained.

With the above described processes, a $p^+$-type region (shaded areas in (h) and (i) in FIG. 6) is formed in each of the sidewalls 231 and the bottom portion 232 of the isolation trench 230. This allows the dopant concentration of boron that exists in the p-type substrate 201 to be sufficient for cancelling segregation into the silicon dioxide film 250 in the isolation trench 230, thereby preventing inversion of the p-type region to an n-type region in the periphery of the isolation trench 230. Accordingly, since a conduction path between two n-type regions on the both sides of the isolation trench 230 can be removed, an excellent isolation between the adjacent devices can be achieved.

CITATION LIST

Patent Literature

[PTL 1] Japanese Unexamined Patent Application Publication No. 61-133623

SUMMARY

Technical Problem

As described above, when the bipolar transistor is used in the analog circuit in the analog-digital mixed-signal integration circuit, an increase in the number of additional steps in the processes and an increase in the area of the bipolar transistor are required to be small.

A method for decreasing the number of processes is proposed for a vertical NPN bipolar transistor having a structure in which the emitter, the base, and the collector are formed in the vertical direction on a semiconductor substrate. In the method, a highly concentrated n-type buried layer and an n-type epitaxial layer are formed in a collector region by ion implantation performed from the surface of the semiconductor substrate.

However, when the trench isolation structure is applied, for the purpose of decreasing the area of the transistor, to the bipolar transistor which does not have a highly concentrated n-type buried layer in the collector region, the following problem arises. This problem will be described with reference to FIGS. 7A and 7B.

FIG. 7A is a cross-sectional view around the trench isolation structure in the bipolar transistor which does not have a highly concentrated n-type buried layer in the collector region and has the trench isolation structure, and FIG. 7B is an equivalent circuit diagram of FIG. 7A.

As shown in FIG. 7A, a deep trench 311 having a deep trench shape is formed on a p-type semiconductor substrate 310. At the bottom portion of the deep trench 311, a p-type channel stopper layer 330 is formed. On the internal wall of the deep trench 311, a trench sidewall $SiO_2$ film 341 is formed. Moreover, inside the deep trench 311, an in-trench polysilicon film 342 is formed. On the deep trench 311, a shallow trench 312 having a shallow trench shape is formed. Furthermore, a first n-type collector diffusion layer 321 is formed inside a region surrounded by the deep trench 311, and a second n-type collector diffusion layer 322 is formed outside the region surrounded by the deep trench 311.

Moreover, a p-type base diffusion layer 361 is formed on the first n-type collector diffusion layer 321, that is, the surface side of the p-type semiconductor substrate 310, and a highly concentrated p-type external base diffusion layer 362 is formed at a portion in contact with an electrode in the p-type base diffusion layer 361. On the other hand, an n-type external collector diffusion layer 323 is formed at a portion in contact with a collector terminal in a second n-type collector diffusion layer 322.

It is to be noted that, given that terminals which apply voltage on the p-type external base diffusion layer 362, the highly concentrated n-type external collector diffusion layer 323, and the p-type semiconductor substrate 310 are a base terminal (VB) 371, a collector terminal (VC2) 372, a substrate terminal (VSUB) 373, respectively, an equivalent circuit diagram of the deep trench 311, the first n-type collector diffusion layer 321, the second n-type collector diffusion layer 322, and the p-type base diffusion layer 361 shown in FIG. 7A has a structure as shown in FIG. 7B.

As shown in FIG. 7B, a parasitic PchMOS transistor in which the in-trench polysilicon film 342 in the deep trench 311 functions as a gate, the trench sidewall $SiO_2$ film 341 functions as a gate oxide film, the p-type base diffusion layer 361 functions as a source, the p-type semiconductor substrate 310 functions as a drain, and the first n-type collector diffusion layer 321 functions as a well is formed along the sidewalls of the deep trench 311.

Moreover, an electrical potential of the in-trench polysilicon film 342 in the deep trench 311 varies depending on an electrical potential (VC2) of the second n-type collector diffusion layer 322.

In the case of this structure, since the dopant concentration in the first n-type collector region 321 is lower than that in the structure having a highly concentrated n-type buried layer in the collector region by 3 to 4 orders, a p-type inversion region 390 as shown in FIG. 7A is formed at a portion in contact with the trench sidewall SiO$_2$ film 341 in the first n-type collector diffusion layer 321 when the electrical potential of the in-trench polysilicon film 342 in the deep trench 311 is lower than an electrical potential of the first n-type collector diffusion layer 321. Consequently, the problem arises that a leakage current easily flows between the p-type base diffusion layer 361 and the p-type semiconductor substrate 310, and thus a breakdown voltage between the base and the semiconductor substrate in the bipolar transistor is decreased.

The present invention was conceived in view of the above-described problem and has an object to provide a semiconductor device which is capable of reducing the leakage current even when the area of a transistor is decreased, and a method of manufacturing the same.

Solution to Problem

In order to solve the above-described problem, an aspect of a semiconductor device according to the present invention includes: a semiconductor substrate of a first conductivity type; a first diffusion layer formed in the semiconductor substrate and doped with a dopant of a second conductivity type that is a conductivity type opposite to the first conductivity type; a trench which is formed in the semiconductor substrate to surround the first diffusion layer and which forms an isolation region; a second diffusion layer formed below the trench and doped with a dopant of the first conductivity type; and a third diffusion layer formed between a sidewall of the trench and the first diffusion layer, and doped with a dopant of the second conductivity type.

Accordingly, the second diffusion layer of the first conductivity type is formed below the trench, and the third diffusion layer of the second conductivity type is formed between the sidewall of the trench and the first diffusion layer. With this, diffusion layers having different conductivity types can be formed below the trench and at the sidewall of the trench, so that generation of inversion layer along a sidewall portion of the trench can be prevented, thereby suppressing generation of a leakage current.

Furthermore, in an aspect of the semiconductor device according to the present invention, it is preferable that a concentration of the dopant in the third diffusion layer is higher than a concentration of the dopant in the first diffusion layer.

Furthermore, in an aspect of the semiconductor device according to the present invention, it is preferable that the third diffusion layer is formed only at a side portion of the trench.

Furthermore, in an aspect of the semiconductor device according to the present invention, it is preferable that the third diffusion layer is formed at the sidewall of the trench at a position above a boundary between the semiconductor substrate and the first diffusion layer, the boundary being a boundary at an inner side of the semiconductor substrate.

Furthermore, in an aspect of the semiconductor device according to the present invention, it is preferable that the third diffusion layer is formed to extend obliquely downward from the side portion of the trench.

Furthermore, in an aspect of the semiconductor device according to the present invention, it is preferable that the first diffusion layer is a collector region.

Furthermore, in an aspect of the semiconductor device according to the present invention, it is preferable that the first conductivity type is p-type, the second conductivity type is n-type, the semiconductor device further comprises a p-type base region formed above the first diffusion layer, and the semiconductor device is a vertical NPN bipolar transistor.

Furthermore, an aspect of a method of manufacturing the semiconductor device according to the present invention includes: forming a first diffusion layer in a semiconductor substrate of a first conductivity type by doping a dopant of a second conductivity type that is a conductivity type opposite to the first conductivity type; forming a trench which forms an isolation region surrounding the first diffusion layer in the semiconductor substrate; forming a second diffusion layer in a region below the trench by doping a dopant of the first conductivity type; and forming a third diffusion layer by doping a dopant of the second conductivity type from a sidewall of the trench.

With this, with a small number of manufacturing processes, the diffusion layers having the different conductivity types can be formed below the trench and at the sidewalls of the trench.

Furthermore, in an aspect of the method of manufacturing the semiconductor device according to the present invention, it is preferable that in the forming of the third diffusion layer, the doping is performed by ion implantation, and the ion implantation is performed at a first angle tilted from a direction perpendicular to a main surface of the semiconductor substrate and a second angle rotated from a direction perpendicular to a sidewall face of the trench.

Furthermore, in an aspect of the method of manufacturing the semiconductor device according to the present invention, it is preferable that the first angle is an angle which enables the ion implantation to the sidewall of the trench in the region from the boundary between the semiconductor substrate and the first diffusion layer to the surface of the first diffusion layer, and the second angle is larger than 0 degrees and smaller than 90 degrees.

Furthermore, in an aspect of the method of manufacturing the semiconductor device according to the present invention, it is preferable that the second angle is 45 degrees.

Furthermore, in an aspect of the method of manufacturing the semiconductor device according to the present invention, it is preferable that the first angle is equal to an angle which causes channeling in a crystal plane of a sidewall portion in the trench.

Advantageous Effects

According to the semiconductor device in the present invention, transistor characteristics can be improved because a leakage current can be reduced.

Moreover, according to the method of manufacturing the semiconductor device in the present invention, a semiconductor device having excellent transistor characteristics can be manufactured with a small number of processes.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENT

Embodiment 1

The following describes a semiconductor device and a method of manufacturing the same according to an embodiment of the present invention with reference to the drawings. It is to be noted that the diagrams are schematic diagrams, and the illustration is not necessarily strictly accurate.

Figure 1:
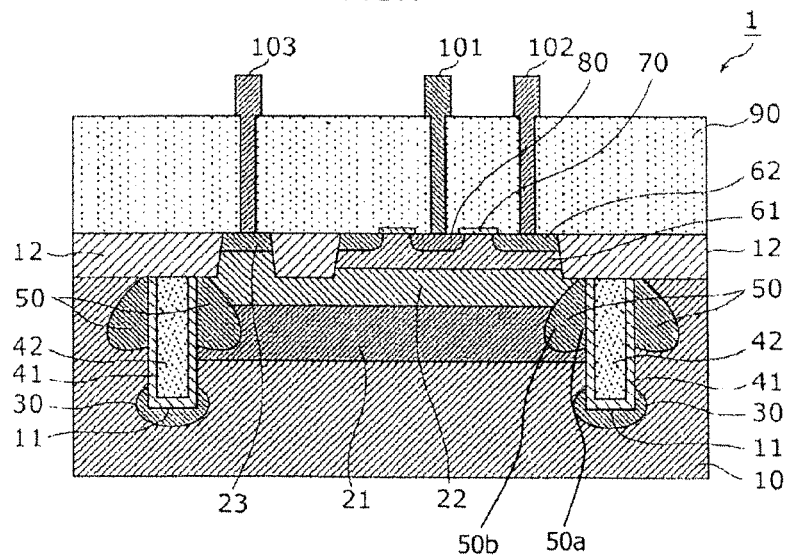
FIG. 1 is a cross-sectional view showing a structure of a semiconductor device according to an embodiment of the present invention.

The following describes a semiconductor device 1 according to the embodiment of the present invention with reference to FIG. 1. FIG. 1 is a cross-sectional view showing a structure of the semiconductor device according to the embodiment of the present invention.

The semiconductor device 1 according to the embodiment of the present invention is, as shown in FIG. 1, a vertical NPN bipolar transistor in which an isolation trench including a deep trench (Deep Trench Isolation: DTI) 11 that is a first trench and a shallow trench (Shallow Trench Isolation: STI) 12 that is a second trench is formed as an isolation region for isolating the bipolar transistor from other devices and the like in a p-type semiconductor substrate (a semiconductor substrate of a first conductivity type) 10 that is a p-type silicone substrate of the first conductivity type.

As shown in FIG. 1, in a region surrounded by the deep trench 11 and the shallow trench 12, a first n-type collector diffusion layer (a first diffusion layer) 21 and a second n-type collector diffusion layer 22 doped with an n-type (a second conductivity type) dopant which is of a conductivity type opposite to the first conductivity type. The first n-type collector diffusion layer 21 is formed to be surrounded by the deep trench 11, and the second n-type collector diffusion layer 22 is formed to be surrounded by the deep trench 11 and the shallow trench 12.

The deep trench 11 has a deep trench shape with a uniform trench width, and has a depressed cross-sectional shape defined by vertical side portions (sidewalls) and a horizontal bottom portion.

Beneath the deep trench 11 in the p-type semiconductor substrate 10, a p-type channel stopper layer (a second diffusion layer) 30 doped with a p-type dopant is formed. The p-type channel stopper layer 30 is formed in the periphery of a lower portion of the deep trench 11, that is, a region directly under the deep trench 11 and a region in the periphery of the lower side of the deep trench 11 for the purpose of preventing the p-type semiconductor substrate 10 from inverting to be n-type in the region below the deep trench 11. Moreover, the p-type channel stopper layer 30 is capable of preventing a collector dopant region in an adjacent bipolar transistor from electrically being connected.

On inner surface of the sidewalls of the deep trench 11, a trench sidewall $SiO_2$ film 41 made of a $SiO_2$ film is formed. Moreover, the deep trench 11 is filled with an in-trench polysilicon film 42 via the trench sidewall $SiO_2$ film 41.

Moreover, at the side portions of the deep trench 11, n-type diffusion layers (third diffusion layers) 50 doped with the n-type dopant is formed. Each of the n-type diffusion layers 50 is formed at a portion where the first n-type collector diffusion layer 21 and the second n-type collector diffusion layer 22 are in contact with the trench sidewall $SiO_2$ film 41. In this embodiment, the dopant concentration in the n-type diffusion layer 50 is higher than the dopant concentration in the first n-type collector diffusion layer 21. Moreover, the n-type diffusion layer 50 is formed, in the periphery of the deep trench 11, at a position above a junction of the first n-type collector diffusion layer 21 and the p-type semiconductor substrate 10 (an interface of the first n-type collector diffusion layer 21). Moreover, the n-type diffusion layers 50 are formed to extend obliquely downward from the both side portions of the deep trench 11. Accordingly, the n-type diffusion layer 50 is formed to bulge obliquely downward in a collector region in the p-type semiconductor substrate 10.

At a portion connected with a collector electrode 103 on the substrate-surface side of the second n-type collector diffusion layer 22, an n-type external collector diffusion layer 23 doped with the n-type dopant with a high concentration is formed to be a collector contact region. Moreover, on the second n-type collector diffusion layer 22, a p-type base diffusion layer 61 is formed to be a base region. The p-type base diffusion layer 61 is surrounded by the shallow trench 12 on the deep trench 11 and is formed apart from the n-type diffusion layer 50. That is, the p-type base diffusion layer 61 and the n-type diffusion layer 50 are not in contact with each other.

On the center of the surface side of the p-type base diffusion layer 61, an annular $SiO_2$ film 70 is formed. In a region beneath an opening of the annular $SiO_2$ film 70 in the p-type base diffusion layer 61, an n-type emitter diffusion layer 80 is formed. Moreover, in the p-type base diffusion layer 61, a p-type external base diffusion layer 62 is formed to be a base contact region.

Furthermore, on the surface of the semiconductor device 1 according to this embodiment as shown in FIG. 1, a surface insulating film 90 which is made of a $SiO_2$-type film is formed. On the surface insulating film 90, an emitter electrode 101, a base electrode 102, and the collector electrode 103 are formed. The emitter electrode 101, the base electrode 102, and the collector electrode 103 are electrically connected to an emitter region, the base contact region, and the collector contact region of the bipolar transistor, respectively. In this embodiment, the emitter electrode 101, the base electrode 102, and the collector electrode 103 are connected to the n-type emitter diffusion layer 80, the p-type external base diffusion layer 62, and the n-type external collector diffusion layer 23, respectively, via contact holes formed to penetrate the surface insulating film 90.

Next, the method of manufacturing the semiconductor device according to the embodiment of the present invention described with reference to FIG. 1 will be described with reference to FIGS. 2A to 2E and FIGS. 3A to 3C. FIGS. 2A to 2E are cross-sectional views showing processes in the method of manufacturing the semiconductor device according to the embodiment of the present invention. FIGS. 3A to 3B are a plan view and cross-sectional views showing an angle of dopant ion implantation in the process of forming the n-type diffusion layer in the method of manufacturing the semiconductor device according to the embodiment of the present invention.

Figure 2A:
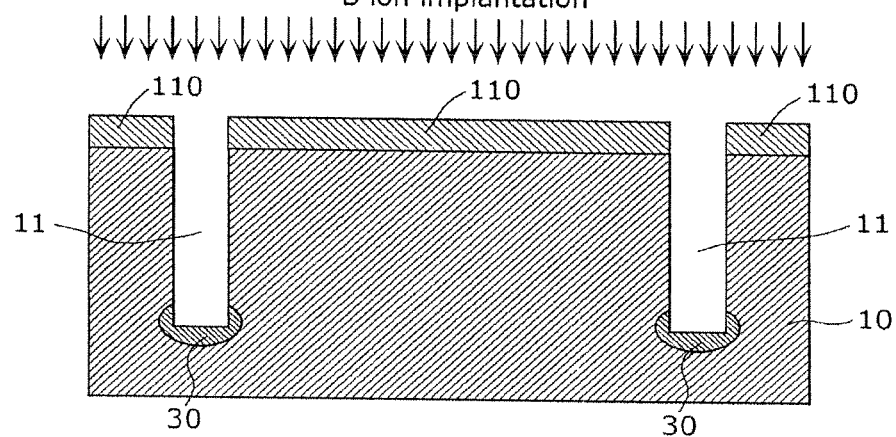
FIG. 2A is a cross-sectional view showing a process of forming an isolation trench in a method of manufacturing the semiconductor device according to the embodiment of the present invention.
Figure 3A:
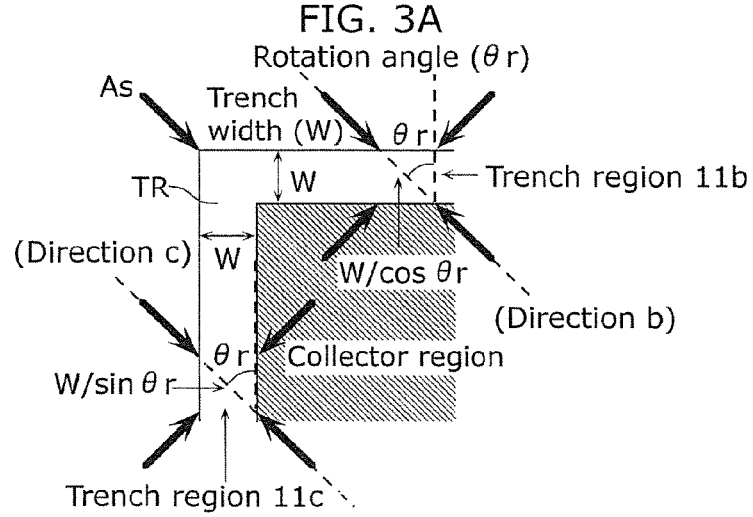
FIG. 3A is a plan view showing an angle of dopant ion implantation in the process of forming the n-type diffusion layer in the method of manufacturing the semiconductor device according to the embodiment of the present invention.
Figure 3B:
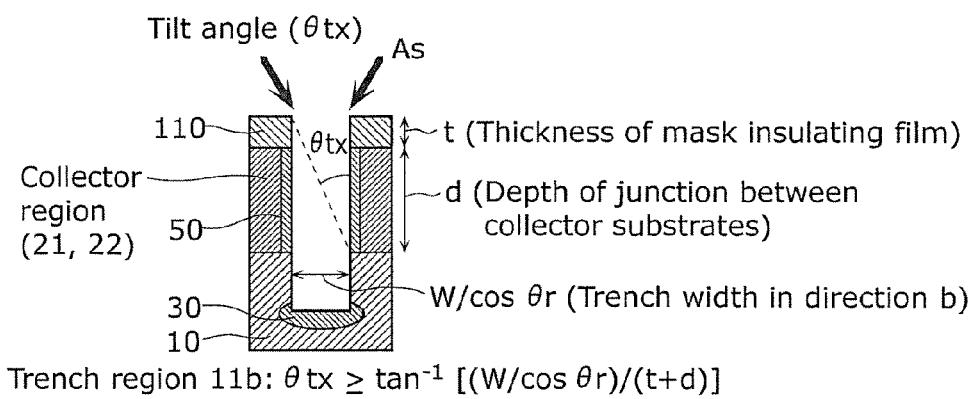
FIG. 3B is a cross-sectional view of a trench region 11b along a direction b in FIG. 3A.

First, as shown in FIG. 2A, an insulating film 110 is formed with a thickness of from 200 nm to 1000 nm on the p-type semiconductor substrate 10, and the deep trench 11 is formed as the isolation region for isolating the bipolar transistor from other devices. Subsequently, the p-type channel stopper layer 30 is formed beneath the deep trench 11 in the p-type semiconductor substrate 10 by performing ion implantation of B(boron) that is the p-type dopant, from the direction perpendicular to the surface of the substrate (the main surface) of the p-type semiconductor substrate 10. At this time, the B ion implantation is performed such that B dopant is highly concentrated. In this embodiment, the dopant concentration in the p-type channel stopper layer 30 is between $1\times10^{16}$ and $1\times10^{19}$ $(cm^{-3})$ inclusive. It is to be noted that as the forming method described above, a method equivalent to a known method of isolating a semiconductor device can be used.

Here, the insulating film 110 can be made of a $SiO_2$ film formed by performing thermal oxidation on the p-type semiconductor substrate 10, can be formed by depositing silicon nitride films, TEOS films, polysilicon films, or others, or can be formed with a monolayer film or a multilayer film including these films. It is to be noted that a structure and a thickness of the monolayer film or the multilayer film are set to improve consistency with after processes.

The deep trench 11 has a trench width from 0.4 μm to 1.0 μm and a trench depth from 2 μm to 5 μm, and is formed by etching to be sufficiently deep, reaching below the region where the first n-type collector diffusion layer 21 that is to be the collector region is formed.

Figure 2B:
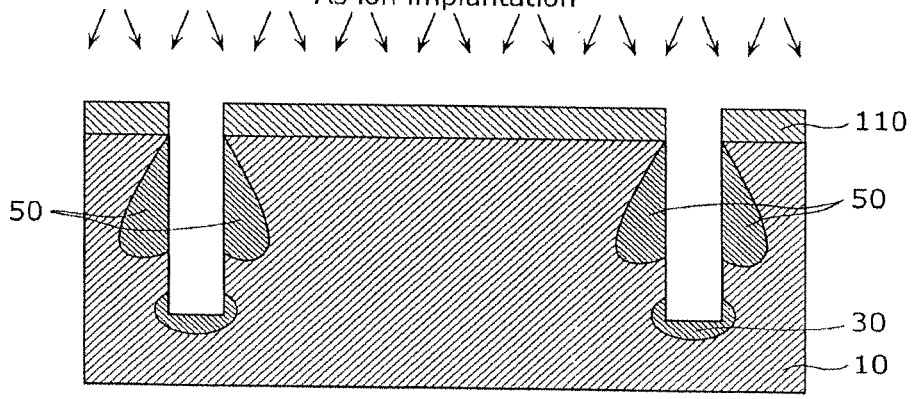
FIG. 2B is a cross-sectional view showing a process of forming an n-type diffusion layer in the method of manufacturing the semiconductor device according to the embodiment of the present invention.

Next, as shown in FIG. 2B, highly concentrated As (arsenic) ion implantation is performed from a direction tilted by a fixed angle (hereinafter referred to as "tilt angle") from the direction perpendicular to the surface of the p-type semiconductor substrate 10, so that the highly concentrated n-type diffusion layer 50 is formed to be a part of the collector region at the sidewall portions of the deep trench 11. That is, the dopant ion implantation for the n-type diffusion layer 50 is oblique ion implantation in which doping is performed obliquely downward.

Here, in the highly concentrated As ion implantation, the tilt angle is set in a range between 6 degrees and 70 degrees inclusive, an acceleration energy is set in a range between 100 keV and 200 keV inclusive, and a dose amount is set in a range between $4\times10^{12}/cm^2$ and $1\times10^{14}/cm^2$ inclusive. In this embodiment, the dopant concentration in the n-type diffusion layer 50 is between $5\times10^{16}$ and $1\times10^{19}$ $(cm^{-3})$ inclusive. The tilt angle is an angle which enables ion implantation to the sidewalls of the deep trench 11 at least in the region from the boundary between the p-type semiconductor substrate 10 and the first n-type collector diffusion layer 21 to the surface of the first n-type collector diffusion layer 21.

Furthermore, the highly concentrated As ion implantation is performed at an angle rotated from the direction perpendicular to the sidewall face of the deep trench 11 (hereinafter referred to as "rotation angle") in the plane of the p-type semiconductor substrate 10. Here, the rotation angle is set to larger than 0 degrees and smaller than 90 degrees. Details of the methods for setting conditions (the tilt angle, the rotation angle, the acceleration energy, and the dose amount) in the ion implantation to the sidewalls of the deep trench 11 will be described later.

Figure 2C:
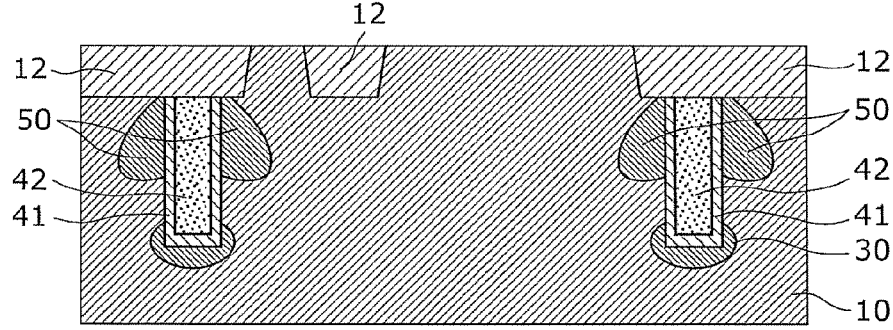
FIG. 2C is a cross-sectional view showing a process of forming a trench portion in the method of manufacturing the semiconductor device according to the embodiment of the present invention.

Next, as shown in FIG. 2C, the trench sidewall $SiO_2$ film 41 with a thickness of from 100 nm to 200 nm is formed on the internal surface of the deep trench 11 by thermal oxidation. Subsequently, the in-trench polysilicon film 42 is formed by filling the deep trench 11 with a polysilicon film (a polycrystalline silicon film) using Chemical Vapor Deposition (hereinafter referred to as "CVD method").

Next, the shallow trench 12 is formed in a region on the deep trench 11 and in the periphery of the region on the deep trench 11, and a region except a p-type base region and except a portion forming a collector lead region in the p-type semiconductor substrate 10. The trench width of the shallow trench 12 is larger than the trench width of the deep trench 11 by from 0.1 μm to 1.0 μm in the periphery of the deep trench 11, and is from 0.4 μm to 2.0 μm at the portion between the p-type base region and the portion forming the collector lead region. Moreover, the shallow trench 12 has a trench depth of from 0.2 μm to 0.5 μm, and is shallowly formed by etching.

After the shallow trench 12 is formed by etching, a $SiO_2$ film is formed with a thickness of from 5 nm to 50 nm on the surface of the shallow trench 12 by thermal oxidation, and the shallow trench 12 is filled with a $SiO_2$ film by CVD method. The shallow trench 12 can be filled with the $SiO_2$ film using a normally used Chemical Mechanical Polishing (hereinafter referred to as "CMP method").

Figure 2D:
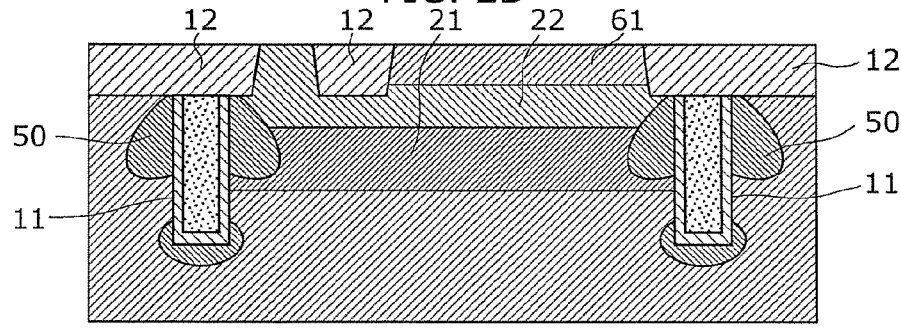
FIG. 2D is a cross-sectional view showing a process of forming a collector region and a base region in the method of manufacturing the semiconductor device according to the embodiment of the present invention.

Next, as shown in FIG. 2D, the first n-type collector diffusion layer 21 and the second n-type collector diffusion layer 22 which are to be a part of the collector region are formed in the region surrounded by the deep trench 11 and the shallow trench 12 by ion implantation and thermal treatment. The first n-type collector diffusion layer 21 and the second n-type collector diffusion layer 22 are formed by ion implantation of P (phosphorus) that is an n-type dopant. Here, in the P ion implantation for the first n-type collector diffusion layer 21, the acceleration energy is set in a range between 800 keV and 1500 keV inclusive, and the dose amount is set in a range between $1\times10^{12}/cm^2$ and $1\times10^{14}/cm^2$ inclusive. Moreover, in the P ion implantation for the second n-type collector diffusion layer 22, the acceleration energy is set in a range between 30 keV and 800 keV inclusive, and the dose amount is set in a range between $0.5\times10^{12}/cm^2$ and $1\times10^{13}/cm^2$ inclusive. In this embodiment, the dopant concentration in the first n-type collector diffusion layer 21 is between $1\times10^{16}$ and $1\times10^{18}$ $(cm^{-3})$ inclusive, and the dopant concentration in the second n-type collector diffusion layer 22 is between $5\times10^{15}$ and $1\times10^{17}$ (cm$^{-3}$) inclusive. Here, the junction (boundary) between the first n-type collector diffusion layer 21 and the p-type semiconductor substrate 10 is formed to be positioned above the bottom portion of the deep trench 11 and below the n-type diffusion layer 50.

Next, the p-type base diffusion layer 61 that is to be the base region is formed on the second n-type collector diffusion layer 22 by ion implantation and thermal treatment. At this time, in the B (boron) ion implantation in forming the p-type base diffusion layer 61, the acceleration energy is set in a range between 20 keV and 80 keV inclusive, and the dose amount is set in a range between $1\times10^{12}$/cm$^2$ and $1\times10^{14}$/cm$^2$ inclusive. Moreover, the p-type base diffusion layer 61 is formed to be apart from the n-type diffusion layer 50 via the shallow trench 12 on the deep trench 11.

Figure 2E:
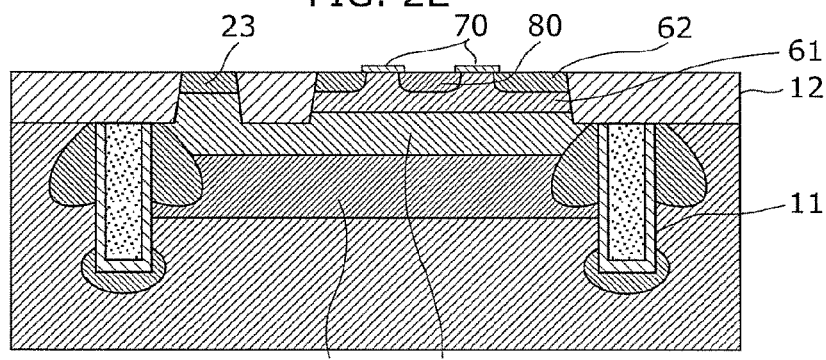
FIG. 2E is a cross-sectional view showing a process of forming an emitter region and an external base region in the method of manufacturing the semiconductor device according to the embodiment of the present invention.

Next, as shown in FIG. 2E, a SiO$_2$ film with a thickness of from 10 to 50 nm is formed by thermal oxidation or the CVD method on the p-type base diffusion layer 61, and patterning is performed on the SiO$_2$ film using known techniques of lithography and etching to form the annular SiO$_2$ film 70. By performing highly concentrated As (arsenic) ion implantation using a resist formed by lithography as a mask (not shown), a highly concentrated n-type emitter diffusion layer 80 is formed in a region corresponding to the inside of the annular SiO$_2$ film 70 and a region beneath the inner edge of the annular SiO$_2$ film 70 in the p-type base diffusion layer 61. Moreover, simultaneously with forming the n-type emitter diffusion layer 80, an n-type external collector diffusion layer 23 is formed on the surface of the collector lead region by the above highly concentrated As ion implantation. Here, in the highly concentrated As ion implantation, the acceleration energy is set in a range between 10 keV and 80 keV inclusive, and the dose amount is set in a range between $1\times10^{15}$/cm$^2$ and $5\times10^{16}$/cm$^2$ inclusive.

Similarly, by performing highly concentrated B (boron) ion implantation using the above resist formed by lithography as the mask (not shown), a p-type external base diffusion layer 62 is formed to be the base contact region in a region corresponding to the outside of the annular SiO$_2$ film 70. Here, in the highly concentrated B ion implantation, the acceleration energy is set in a range between 10 keV and 80 keV inclusive, and the dose amount is set in a range between $1\times10^{15}$/cm$^2$ and $5\times10^{16}$/cm$^2$ inclusive. Subsequently, the dopants in the n-type emitter diffusion layer 80, the n-type external collector diffusion layer 23, and the p-type external base diffusion layer 62 are activated by thermal treatment.

Subsequently, although not shown, the surface insulating film 90 made of a SiO$_2$ film and the like is deposited by the CVD method so as to cover the shallow trench 12, the annular SiO$_2$ film 70, the n-type emitter diffusion layer 80, the n-type external collector diffusion layer 23, and the p-type external base diffusion layer 62. Subsequently, contact holes are formed in the surface insulating film 90 on the n-type emitter diffusion layer 80, the n-type external collector diffusion layer 23, and the p-type external base diffusion layer 62, and then the emitter electrode 101, the base electrode 102, and the collector electrode 103 are formed.

Accordingly, the semiconductor device 1 according to the embodiment of the present invention as shown in FIG. 1 can be manufactured.

Figure 3C:
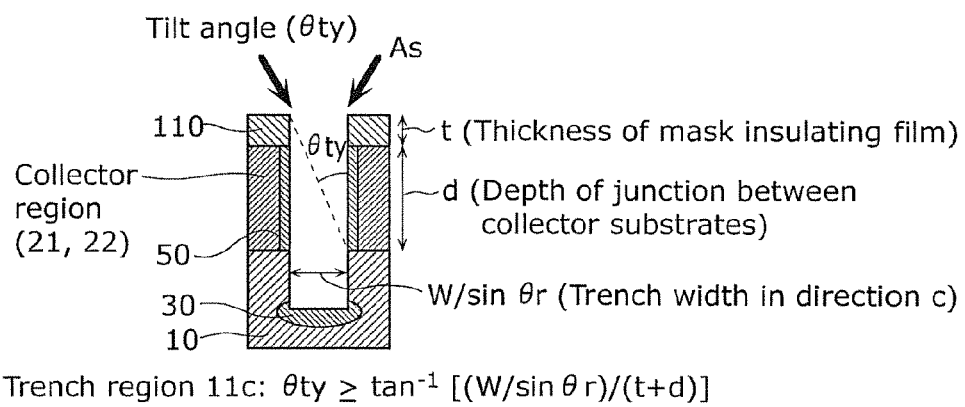
FIG. 3C is a cross-sectional view of a trench region 11c along a direction c in FIG. 3A.

The following describes details of a method of manufacturing the n-type diffusion layer 50 at the sidewall portions of the deep trench 11 shown in FIG. 2B with reference to FIGS. 3A to 3C. Here, FIG. 3A is a plan view showing directions of ion implantation in an ion implantation process in the process of forming the n-type diffusion layer 50 seen from the direction perpendicular to the surface of the p-type semiconductor substrate. It is to be noted that although only two directions in the deep trench 11 having a width of w are shown in FIG. 3A, the deep trench 11 is formed to surround the four sides of the collector region. Moreover, FIG. 3B is a cross-sectional view of a trench region 11b along a direction b in FIG. 3A. Similarly, FIG. 3C is a cross-sectional view of a trench region 11c along a direction c in FIG. 3A.

As shown in FIG. 3A, the As ion implantation for forming the n-type diffusion layer 50 that is to be a part of the collector region is performed from a direction rotated by a fixed angle (rotation angle: $\theta r$) from the direction perpendicular to a sidewall face of the deep trench 11 so that the As ion implantation is not performed directly to the bottom portion of the deep trench 11. The rotation angle at this time is larger than 0 degrees and smaller than 90 degrees. Moreover, for the purpose of uniformly performing ion implantation to the sidewalls of the deep trench 11 surrounding the four sides of the collector region, the ion implantation is performed from four directions while changing the rotation angle by 90 degrees in the ion implantation process (hereinafter referred to as "four-rotating implantation"). It is to be noted that in FIG. 3A, performing of the above four-rotating implantation is indicated by four bold arrows in each of the trench regions 11b and 11c.

In the trench regions 11b in FIG. 3A, in the case where ion implantation is performed from the direction of the rotation angle ($\theta r$), the ion implantation is performed from a direction tilted from the direction perpendicular to the surface of the p-type semiconductor substrate 10 by a predetermined tilt angle ($\theta tx$) as shown in FIG. 3B. At this time, given that the thickness of the insulating film 110 formed on the p-type semiconductor substrate 10 is t and the depth from the interface between the insulating film 110 and the p-type semiconductor substrate 10 to the junction between the first n-type collector diffusion layer 21 and the p-type semiconductor substrate 10 is d, in order to form the highly concentrated n-type diffusion layer 50 only at a portion in contact with the sidewalls of the deep trench 11 in the collector region, and not to form a highly concentrated collector diffusion layer in a region from the bottom portion of the deep trench 11 to the junction between the first n-type collector diffusion layer 21 and the p-type semiconductor substrate 10 in the sidewall portions of the deep trench 11, the tilt angle($\theta tx$) needs to satisfy (Equation 1) below considering that the trench width of the deep trench 11 in the direction b is expressed by W/cos $\theta r$.

$$\theta tx \geq \tan^{-1}[(W/\cos\theta r)/(t+d)] \quad \text{(Equation 1)}$$

Similarly, in the case where ion implantation is performed from the direction of the rotation angle ($\theta r$) in the trench region 11c in FIG. 3A, the ion implantation is performed from the direction tilted from the direction perpendicular to the surface of the p-type semiconductor substrate 10 by a predetermined tilt angle ($\theta ty$) as shown in FIG. 3C. At this time, similarly to FIG. 3B, in order to form the highly concentrated n-type diffusion layer 50 only at a portion in contact with the sidewalls of the deep trench 11 in the collector region, and not to form a highly concentrated collector diffusion layer in the region from the bottom portion of the deep trench 11 to the junction between the first n-type collector diffusion layer 21 and the p-type semiconductor substrate 10 in the sidewall portions of the deep trench 11, the tilt angle ($\theta ty$) needs to satisfy (Equation 2) below considering that the trench width of the deep trench 11 in the direction c is expressed by W/sin $\theta r$.

$$\theta ty \geq \tan^{-1}[(W/\sin\theta r)/(t+d)] \quad \text{(Equation 2)}$$

Accordingly, in the ion implantation process for forming the n-type diffusion layer 50, the angle of the ion implantation is as follows so that the an ion implantation of the n-type dopant (As) is not directly performed on the bottom portion of the deep trench 11 surrounding the four sides of the collector region, a highly concentrated collector diffusion layer is not formed in the region from the bottom portion of the deep trench 11 to the junction between the first n-type collector diffusion layer 21 and the p-type semiconductor substrate 10, and the highly concentrated n-type diffusion layer 50 is formed only at the portion in contact with the sidewalls of the deep trench 11 in the collector region: the rotation angle with respect to the direction perpendicular to the internal sidewall face of the deep trench 11 is larger than 0 degrees and smaller than 90 degrees, and the tilt angle ($\theta tx$, $\theta ty$) with respect to the direction perpendicular to the surface of the p-type semiconductor substrate 10 needs to satisfy both (Equation 1) and (Equation 2). At this time, the tilt angle is preferably set to an angle larger than the larger angle of (Equation 1) and (Equation 2).

Moreover, the acceleration energy and the dose amount in the ion implantation of n-type dopant (As) are preferably set such that the n-type dopant does not break through the insulating film 110 on the surface of the p-type semiconductor substrate 10 at the time of the ion implantation.

It is to be noted that at the corner of the deep trench 11, a round shape of the corner may cause a little amount of n-type dopant to be implanted into the bottom portion of the corner. Even in this case, the acceleration energy and the dose amount in the ion implantation to the sidewalls are preferably set such that the dopant concentration in the p-type channel stopper layer 30 beneath the deep trench 11 is higher than the dopant concentration of the little amount of n-type dopant implanted into the bottom portion of the corner of the deep trench 11. In this case, with respect to the p-type channel stopper layer 30 beneath the deep trench 11, the ion implantation can be performed from the direction perpendicular to the surface of the p-type semiconductor substrate 10. Moreover, the ion implantation can be performed with a large dose amount because the bottom portion of the deep trench 11 and the collector diffusion layer are apart from each other. Thus, even when the acceleration energy and the dose amount are large in the ion implantation to the sidewalls, the p-type channel stopper layer 30 can be formed with a concentration required for electrically isolating the n-type collector region adjacent to the deep trench 11.

As described above, when the rotation angle is larger than 0 degrees and smaller than 90 degrees, and when the tilt angle ($\theta tx$, $\theta ty$) with respect to the direction perpendicular to the surface of the substrate is an angle which satisfies both (Equation 1) and (Equation 2), the n-type dopant ion implantation can be performed to the sidewalls of the deep trench 11 at the position above the depth (d) position of the junction between the first n-type collector diffusion layer 21 and the p-type semiconductor substrate 10. It is to be noted that in the case where the rotation angle ($\theta r$) is 45 degrees, the above (Equation 1) and (Equation 2) derive (Equation 3) and (Equation 4) below.

$$\theta tx \geq \tan^{-1}[(2^{1/2} \cdot W)/(t+d)] \quad \text{(Equation 3)}$$

$$\theta ty \geq \tan^{-1}[(2^{1/2} \cdot W)/(t+d)] \quad \text{(Equation 4)}$$

In this case, the tilt angles at which the ion implantation of n-type dopant can be performed at the position above the depth (d) position of the junction between the first n-type collector diffusion layer 21 and the p-type semiconductor substrate 10 are the same in the sidewall of the trench region 11b and the sidewall of the trench region 11c. In other words, in the case where the ion implantation of n-type dopant is performed at the tilt angle ($\theta t$), given that the depth of the n-type dopant implantation from the surface of the p-type semiconductor substrate 10 to each of the sidewall of the trench region 11b and the sidewall of the trench region 11c is dx and dy, respectively, the following (Equation 5) holds.

$$dx = dy = (2^{1/2} \cdot W/\tan \theta t) - t \quad \text{(Equation 5)}$$

As a result, highly concentrated diffusion layers that are to be a part of the collector layer can be formed to have the same depth at the sidewall of the trench region 11b and the sidewall of the trench region 11c, thereby reducing variation in characteristics of the bipolar transistor.

Next, current-voltage characteristics and the relationship between the current and the dose amount of the dopant in the semiconductor device 1 according to the embodiment of the present invention will be described with reference to FIGS. 4A and 4B. It is to be noted that, in this embodiment, the calculation in FIGS. 4A and 4B uses Technology Computer Aided Design (TCAD), and the diagrams show the result of the calculation.

Figure 4A:
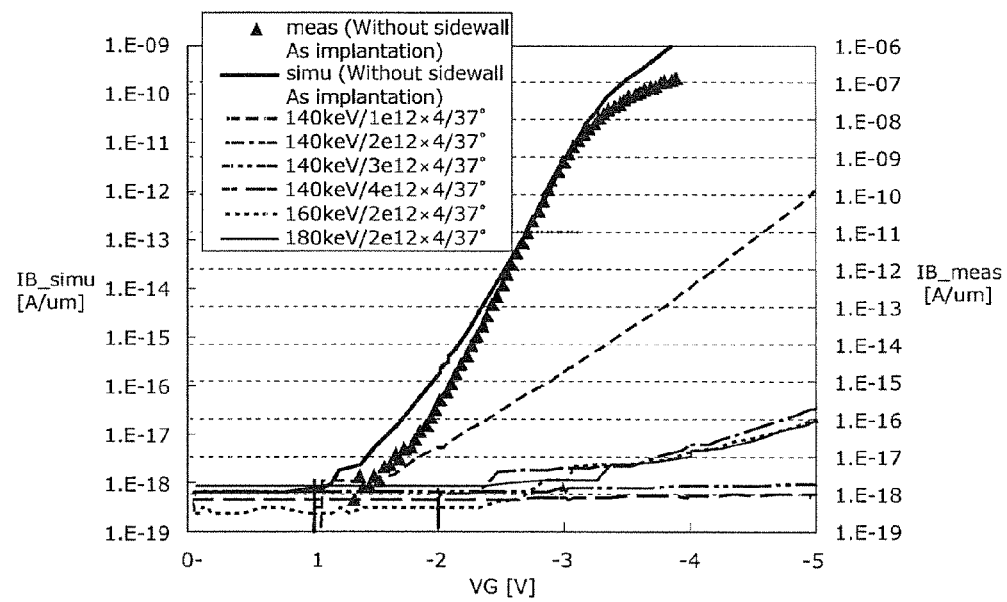
FIG. 4A is a diagram showing current-voltage characteristics in the semiconductor device according to the embodiment of the present invention.

First, FIG. 4A is a diagram showing dependency of an electrical potential (VG) of the in-trench polysilicon film for current (IB) between the base and the semiconductor substrate. In FIG. 4A, the vertical axis indicates IB per μm in a width of a region in which the current flows between the base and the semiconductor substrate, and the horizontal axis indicates VG. Moreover, in FIG. 4A, the trench width of the deep trench 11 is 0.6 μm, the acceleration energy is set to 1200 keV and the dose amount is set to $3 \times 10^{12}/cm^2$ in the P (phosphorus) ion implantation for the first n-type collector diffusion layer 21, and the acceleration energy is set to 300 keV and the dose amount is set to $2 \times 10^{12}/cm^2$ in the P (phosphorus) ion implantation for the second n-type collector diffusion layer 22. Moreover, the As ion implantation to the sidewalls of the deep trench 11 is performed by the four-rotating implantation in which the tilt angle is set to 37 degrees and the rotation angle is set to 45 degrees. Moreover, a silicon substrate is used as the p-type semiconductor substrate 10, a crystal plane of the surface of the substrate is a <100> plane, and a crystal plane of the sidewalls of the deep trench 11 is a <110> plane. Furthermore, thermal oxidation is performed on the $SiO_2$ film on the sidewalls of the deep trench 11 such that the film thickness at the bottom portion of the deep trench 11 is 100 nm.

Moreover, FIG. 4A shows a measured value (meas) and the result of numerical calculation (simu) in the case of without As ion implantation to the sidewalls of the deep trench 11, and IB-VG characteristics (6 patterns) in a variety of acceleration energy and dose amount in the As ion implantation to the sidewalls of the deep trench 11. In the diagram, the scale of the measured value (meas) is shown at the right vertical axis and the scale of the result of numerical calculation (simu) is shown at the left vertical axis. Moreover, since the As ion implantation is performed by the four-rotating implantation, the dose amount is expressed by the dose amount per doping× 4.

As shown in FIG. 4A, in the case of without As ion implantation to the sidewalls of the deep trench 11, VG is $10^{-7}$ A/μm around 4 V for the measured value (meas) of the current (IB) between the base and the semiconductor substrate. On the other hand, in the case where As ion implantation is performed to the sidewalls of the deep trench 11 with an acceleration energy of 140 keV and an dose amount of $4 \times 10^{12}/cm^2 \times 4$ rotations, for the current (IB) between the base and the semiconductor substrate, VG is less than $10^{-18}$ A/μm around 4V. This shows that it is possible to significantly reduce the current (IB) between the base and the semiconductor substrate when the electrical potential in the polysilicon film in the deep trench 11 is high by performing the As ion implantation to the sidewalls of the deep trench 11.

Figure 4B:
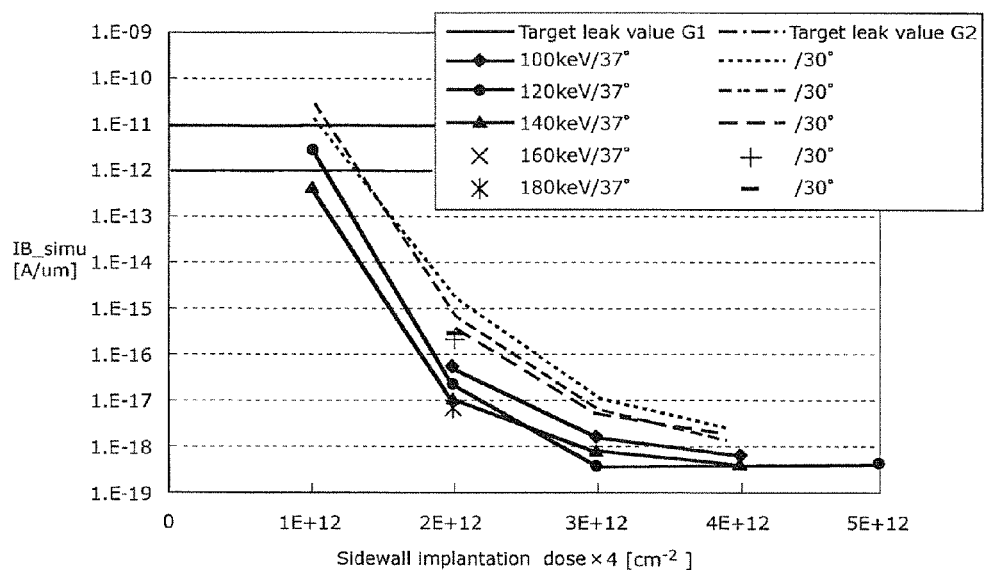
FIG. 4B is a diagram showing a relationship between the current and dose amount of the dopant in the semiconductor device according to the embodiment of the present invention.

Next, FIG. 4B is a diagram showing dependency of the As ion implantation to the sidewalls of the deep trench 11 on the dose amount with respect to the current (IB) between the base and the semiconductor substrate in the case where the electrical potential (VG) of the polysilicon film in the deep trench 11 is 4.1 V. In FIG. 4B, the vertical axis indicates IB (the result of numerical calculation) per µm in a width of a region in which the current flows between the base and the semiconductor substrate, and the horizontal axis indicates dose amount of As to the sidewalls. It is to be noted that since the ion implantation is performed by the four-rotating implantation, the dose amount is expressed by the dose amount per doping×4 as in FIG. 4A.

Moreover, in FIG. 4B, the trench width of the deep trench 11, the conditions in forming the first n-type collector diffusion layer 21 and the second n-type collector diffusion layer 22, the direction of the crystal planes of the p-type semiconductor substrate and the sidewalls of the deep trench 11, and the thickness of the $SiO_2$ film on the sidewalls and the bottom portion of the deep trench 11 are the same as those in the case of FIG. 4A. The As ion implantation to the sidewalls of the deep trench 11 is performed with the conditions that the rotation angle is 45 degrees, and the tilt angle is 37 degrees and 30 degrees.

It is to be noted that in FIG. 4B, a target leak value G1 of the current (IB) between the base and the semiconductor substrate is set to $10^{-11}$ A/µm, and a target leak value G2 which is in a level with a smaller leakage current is set to $10^{-12}$ A/µm.

The target leak value G1 of $10^{-11}$ A/µm is in a level with a sufficiently small leakage current as a target value for the leakage current. However, as shown in FIG. 4B, it is possible to reduce the current (IB) between the base and the semiconductor substrate to a very low level that is equal to or less than $10^{-18}$ A/µm by controlling the dose amount, the acceleration energy, and the tilt angle in the As ion implantation to the sidewalls of the deep trench 11 to optimally set the As concentration in the sidewall portions of the deep trench 11 in the collector region.

As described above, it is possible to significantly reduce the leakage current between the base and the semiconductor substrate by the ion implantation of the n-type dopant to the sidewalls of the deep trench 11. Moreover, it is preferable that the thickness of the insulating film 110 on the surface of the semiconductor substrate is thick at the time of ion implantation. With this, it is possible to increase the acceleration energy and the dose amount in the ion implantation to the sidewalls of the deep trench 11, so that a region of the n-type diffusion layer 50 can be easily formed in a large size in the collector region, thereby decreasing collector resistance. With this, it is possible to improve frequency characteristics which can be expressed by cutoff frequency (ft) and maximum oscillating frequency (fmax) and to decrease a saturation voltage between the collector and the emitter (Vcesat), thereby improving the performance of the transistor.

Figure 5:
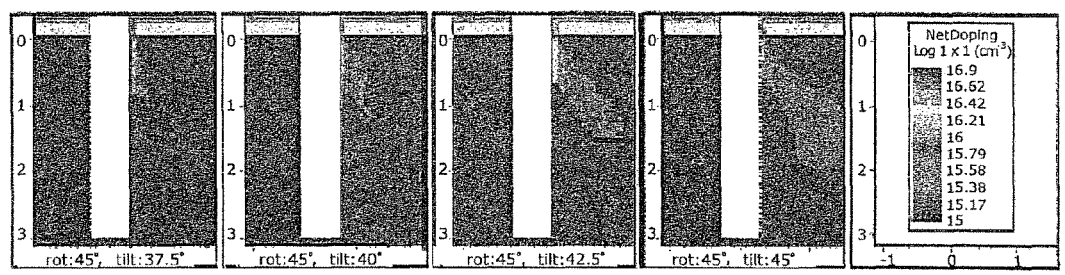
FIG. 5 is a diagram showing dopant concentration distribution in a diffusion layer when a tilt angle is varied in As ion implantation to a sidewall of a deep trench.
Figure 6:
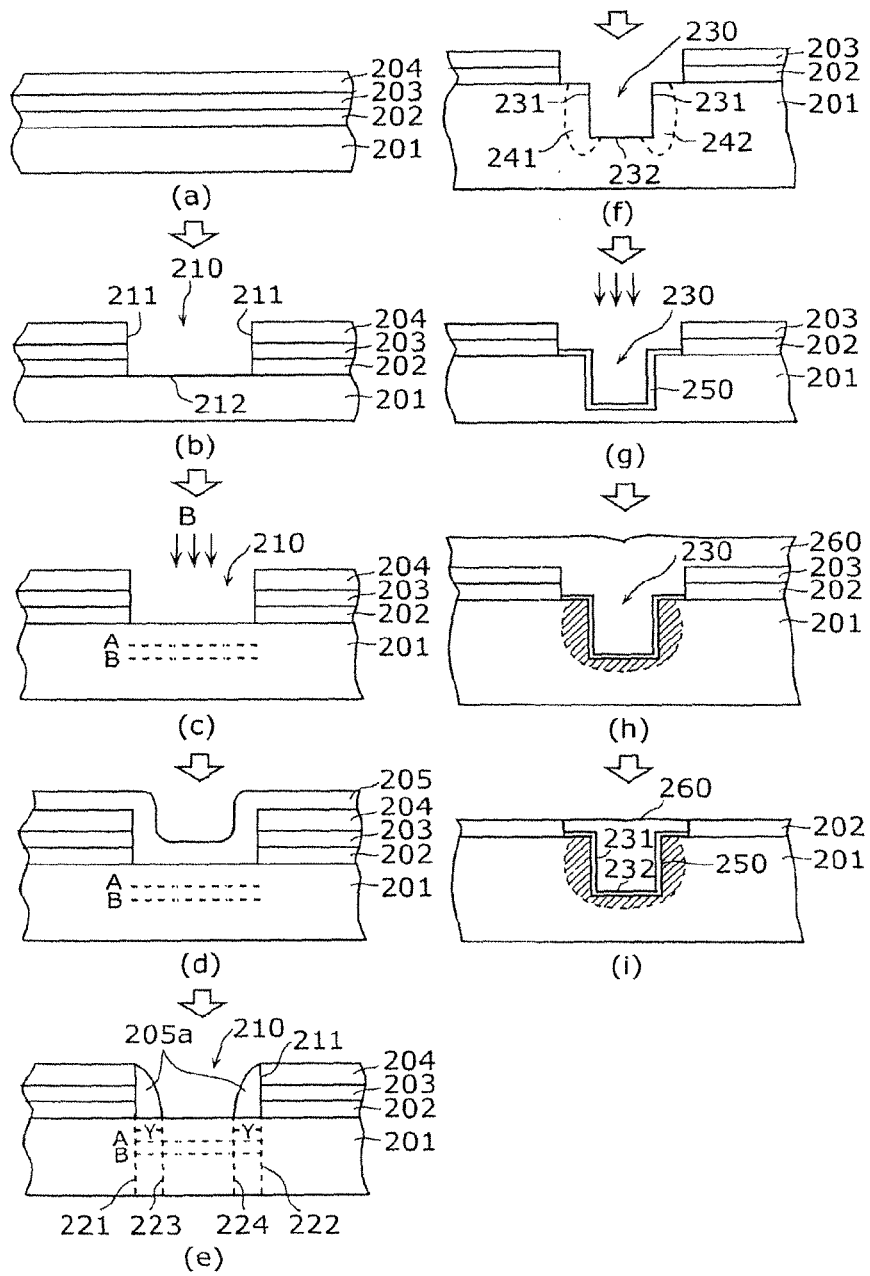
FIG. 6 shows cross-sectional views showing processes of a doping method with regard to a transistor having a trench isolation structure disclosed in PTL 1.
Figure 7A:
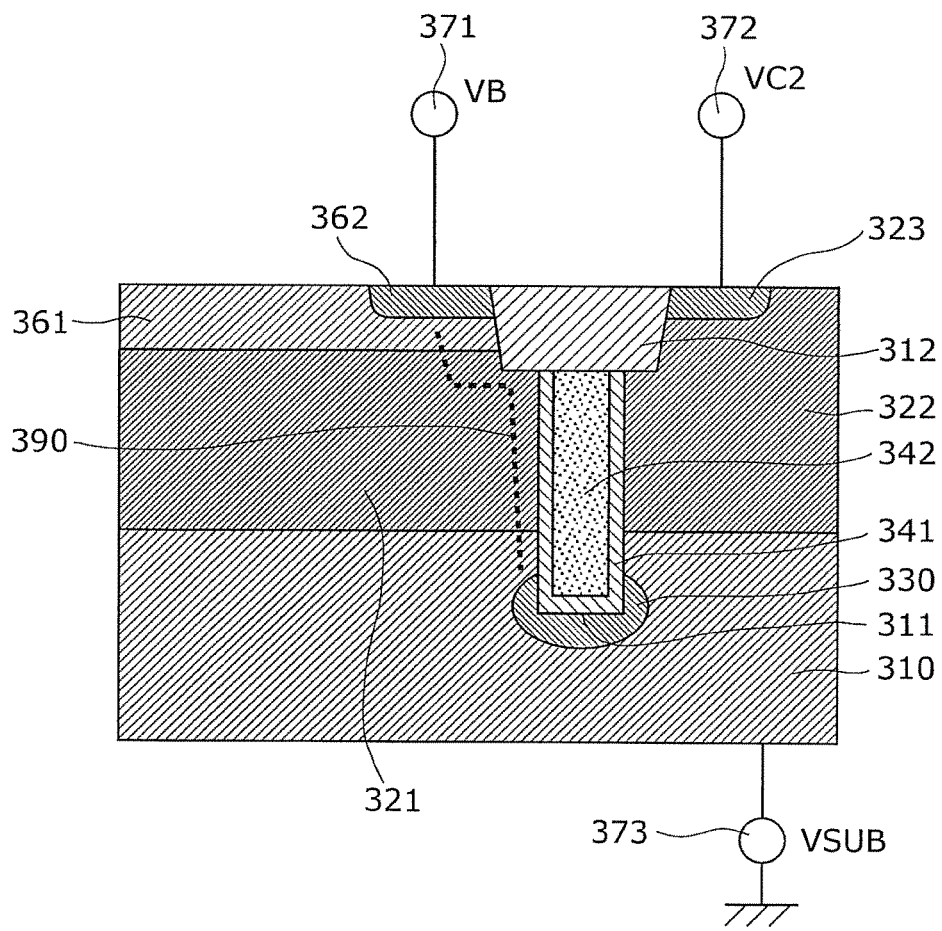
FIG. 7A is a sectional view around the trench isolation structure in a bipolar transistor which does not have a highly concentrated n-type buried layer in a collector region and has the trench isolation structure.
Figure 7B:
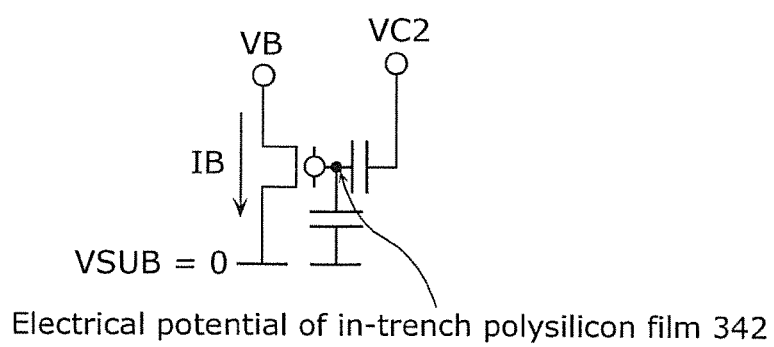
FIG. 7B is an equivalent circuit diagram of the transistor shown in FIG. 7A.

The following describes the case where the tilt angle is varied in the process of As ion implantation to the sidewalls of the deep trench 11 shown in FIGS. 3A to 3C with reference to FIG. 5. FIG. 5 is a diagram showing dopant concentration distribution in a diffusion layer when the tilt angle is varied in As ion implantation to the sidewalls of the deep trench 11. In FIG. 5, the rotation angle is 45 degrees, and the tilt angle is varied from 37.5 degrees to 45 degrees in units of 2.5 degrees. It is to be noted that FIG. 5 shows the result of the numerical calculation of the dopant concentration distribution in a cross-section of the deep trench 11 and the periphery thereof using TCAD, and the horizontal and vertical axes indicate the distance in the cross-section. It is to be noted that the dopant concentration of As in the cross-section is expressed by a grayscale as shown in the rightmost data in FIG. 5.

In FIG. 5, the trench width of the deep trench 11 is set to 0.6 µm. Moreover, the As ion implantation to the sidewall of the deep trench 11 is performed by the four-rotating implantation in which the rotation angle is set to 45 degrees, and the acceleration energy is set to 100 keV, and the dose amount is set to $3.5 \times 10^{11}/cm^2$. Moreover, the crystal plane of the p-type semiconductor substrate 10 is a <100> plane and the crystal plane of the sidewall of the deep trench 11 is a <110> plane. Moreover, in FIG. 5, the portion with a light color expresses the main part of As dopant concentration distribution formed by the ion implantation from the sidewall of the deep trench 11 toward the collector region.

As shown in FIG. 5, the As concentration distribution extends in a wide range in the collector region along the direction of the tilt angle in the cases where the tilt angle is 42.5 degrees and 45 degrees. Moreover, when the tilt angle is 45 degrees, As is extended approximately twice as much in width and in depth as the case where the tilt angle is 40 degrees.

Here, it is known that a silicon substrate has a crystalline structure called a diamond structure in which Si atoms are regularly arranged. It is known that the spaces between the Si atoms vary depending on the direction of a crystal plane, and there is a crystal plane in which the spaces between atoms are large. It is known that when ion implantation is performed in the direction perpendicular to the crystal plane in which the spaces between the atoms are large, the impurity ion is implanted deeply to the crystalline. This phenomenon is called a channeling phenomenon in ion implantation.

As shown in FIG. 5, when As ion implantation is performed from the sidewall of the deep trench 11, the ion implantation at the sidewall of the deep trench 11 can be performed selectively in a direction in which the channeling phenomenon occurs, by appropriately selecting a crystal plane of the sidewall of the deep trench 11, and the rotation angle and the tilt angle in the ion implantation. In this case, it is possible to form a highly concentrated n-type diffusion layer extending to a deep region toward the collector region from the sidewall face of the deep trench 11, thereby significantly decreasing the collector resistance. Moreover, the ion implantation is performed in the oblique direction in this embodiment, so that the highly concentrated n-type diffusion layer formed from the sidewall face of the deep trench 11 to the deep region extends in a direction which increases the distance from the p-type channel stopper layer beneath the bottom portion of the deep trench 11 and the p-type base layer on the surface of the p-type semiconductor substrate. With this, junction capacitance between the collector and the semiconductor substrate or junction capacitance between the collector and the base is not increased, so that the frequency characteristics expressed by ft and fmax can be further improved in the bipolar transistor and the Vcesat voltage can be further decreased, thereby further reducing power consumption in an integrated circuit.

According to the semiconductor device and the method of manufacturing the same according to the embodiment of the present invention as described above, in a low-cost bipolar transistor which has a deep trench and does not have a highly concentrated n-type buried layer in the collector region, diffusion layers having different conductivity types are formed in the region beneath the deep trench and the region in the periphery of the sidewalls of the deep trench. With this, in the case where collector diffusion layers of different bipolar transistors exist at the both sides of the deep trench, the leakage current between the collector diffusion layers can be suppressed by increasing a breakdown voltage between the collector diffusion layers. Moreover, a parasitic MOS transistor formed of the insulating film formed inside the sidewalls of the deep trench and a polysilicon film inside the deep trench is not turned on, so that the breakdown voltage between the base and the semiconductor substrate can be increased.

Moreover, according to the semiconductor device and the method of manufacturing the same according to this embodiment, a highly concentrated collector diffusion layer is not present in the region from the bottom portion of the deep trench to the junction between the collector diffusion layer and the semiconductor substrate, but a highly concentrated diffusion layer is present only in the portion in contact with the sidewalls of the deep trench in the collector region. With this, the breakdown voltage between the collector and the semiconductor substrate does not decrease, and the junction capacitance between the collector and the semiconductor substrate does not increase, thereby improving a range of an operating power voltage and frequency characteristics of the bipolar transistor.

Furthermore, according to the semiconductor device and the method of manufacturing the same according to this embodiment, the highly concentrated collector diffusion layer is present in the periphery of the collector region, so that the collector resistance can be decreased. With this, since the frequency characteristics expressed by ft and fmax can be improved and the Vcesat voltage can be decreased in the bipolar transistor, the operating power voltage can be decreased, thereby reducing power consumption in the integrated circuit. Furthermore, by appropriately selecting the tilt angle, the collector diffusion layer can be formed in a large region from the sidewalls of the deep trench toward the highly concentrated collector diffusion layer in the four directions around each collector region. With this, it is possible to significantly decrease the collector resistance, so that the frequency characteristics expressed by ft and fmax can be further improved and the Vcesat voltage can be further decreased, thereby further reducing power consumption in the integrated circuit.

Furthermore, according to the semiconductor device and the method of manufacturing the same according to this embodiment, the highly concentrated collector diffusion layer in the periphery of the collector region can be disposed to be apart from the base diffusion layer. With this, the breakdown voltage between the collector and the base does not decrease, and the junction capacitance between the collector and the base does not increase, thereby improving the range of the operating power voltage and the frequency characteristics of the bipolar transistor.

Furthermore, according to the manufacturing method in this embodiment, the highly concentrated diffusion layer is formed by the dopant ion implantation at the angle tilted from the direction perpendicular to the main surface of the semiconductor substrate (the tilt angle) and at the angle rotated from the direction perpendicular to the sidewall face of the isolation trench (the rotation angle) to the portion above the junction between the semiconductor substrate and the collector diffusion layer in the sidewall portion of the deep trench. With this, with a small number of manufacturing processes, diffusion layers having different conductivity types can be formed in the region beneath the deep trench and the region in the periphery of the sidewalls of the deep trench.

Moreover, according to the manufacturing method in this embodiment, in the case where the four sides surrounding the bipolar transistor are surrounded by the deep trench, the highly concentrated diffusion layers that are to be a part of the collector layer can be formed to have the same depth at the sidewalls of the four sides of the deep trench by setting the above rotation angle to 45 degrees. With this, it is possible to reduce variation in the characteristics of the bipolar transistor.

Furthermore, according to the manufacturing method in this embodiment, even the acceleration energy and the dose amount is small in performing the ion implantation from the sidewalls of the deep trench, the highly concentrated n-type diffusion layer that is to be a part of the collector region can be formed in a large region extending from the sidewalls of the deep trench in the periphery of the four sides surrounding the collector region by controlling the tilt angle. This allows the thickness of the insulating film that is formed on the surface of the semiconductor substrate to be thin before the ion implantation, thereby reducing cost for the manufacturing process.

Although the semiconductor device and the method of manufacturing the same according to the present invention have been described based on the embodiment, the present invention is not limited to the above-described embodiment, and all the arbitrary applications within the concept of the present invention are included in the present invention.

For example, although As is used as the dopant for the ion implantation to the sidewalls of the deep trench in the above description of the embodiment of the present invention, the present invention can be applied to a structure and a manufacturing method in which an ion species of the same conductivity type as the collector region, for example, P (phosphorus) is used.

Moreover, although the ion implantation is performed once to the sidewalls of the deep trench in the above-described method, the ion implantation may be performed plural times while varying implantation angles, acceleration energy, dose amount, and ion species. For example, the concentration of the dopant in the n-type diffusion layer 50 can be set to have such a concentration as to reduce the leakage current between the base and the semiconductor substrate in a region 50$a$ in the vicinity of the sidewalls of the deep trench, and set to have higher concentration which can decrease the collector resistance in a region 50$b$ apart from the sidewalls. That is, in the n-type diffusion layer, the concentration of the dopant in a region in the vicinity of the first n-type collector diffusion layer can be set higher than the concentration of the dopant in the region in the vicinity of the sidewalls of the deep trench in the n-type diffusion layer.

Moreover, although the vertical NPN transistor is described in the embodiment of the present invention, the present invention is also applicable to a vertical PNP transistor.

Furthermore, although the vertical NPN transistor is described in the embodiment of the present invention, the present invention is also applicable to a horizontal PNP transistor that can be formed simultaneously with the vertical NPN transistor. In the case of the horizontal PNP transistor, a highly concentrated n-type diffusion layer can be formed from the sidewalls of the deep trench in an n-type diffusion layer which is to be a base region. With this, it is possible to decrease the base resistance, thereby reducing noise in the horizontal PNP transistor. Moreover, the present invention is obviously applicable to a horizontal NPN transistor, too.

Furthermore, although the silicon semiconductor substrate is described in the embodiment of the present invention, the present invention is applicable to the case where compound semiconductor substrates such as a GaAs compound semiconductor substrate and an InSb compound semiconductor substrate are used.

Various modifications to the embodiments that are conceived by the person skilled in the art and other embodiments obtainable by arbitrarily combining the constituent elements and functionalities in the embodiments without materially departing from the scope of the present invention are included within the scope of the present invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

Industrial Applicability

The present invention is useful in a semiconductor integrated circuit and the like in which a semiconductor device including a bipolar transistor and others are used.

The invention claimed is:

1. A semiconductor device comprising:
a semiconductor substrate of a first conductivity type;
a first diffusion layer formed in the semiconductor substrate and doped with a dopant of a second conductivity type that is a conductivity type opposite to the first conductivity type;
a first trench and a second trench which are formed in the semiconductor substrate to surround the first diffusion layer and which form an isolation region;
a second diffusion layer formed below the first trench and doped with a dopant of the first conductivity type; and
a third diffusion layer formed between a sidewall of the first trench and the first diffusion layer, and doped with a dopant of the second conductivity type,
wherein the first trench is formed immediately under the second trench to connect to the second trench;
the third diffusion layer is spaced apart from a surface of the semiconductor substrate by the second trench;
a concentration of the dopant in the third diffusion layer is higher than a concentration of the dopant in the first diffusion layer, and
in the third diffusion layer, a concentration of the dopant in a region in a vicinity of the first diffusion layer is higher than a concentration of the dopant in a region in a vicinity of the sidewall of the first trench.

2. The semiconductor device according to claim 1, wherein the third diffusion layer is formed only at a side portion of the first trench.

3. The semiconductor device according to claim 1, wherein the third diffusion layer is formed at the sidewall of the first trench at a position above a boundary between the semiconductor substrate and the first diffusion layer, the boundary being a boundary at an inner side of the semiconductor substrate.

4. The semiconductor device according to claim 1, wherein the third diffusion layer is formed to extend obliquely downward from a side portion of the first trench.

5. The semiconductor device according to claim 1, wherein the first diffusion layer is a collector region.

6. The semiconductor device according to claim 1,
wherein the first conductivity type is p-type,
the second conductivity type is n-type,
the semiconductor device further comprises a p-type base region formed above the first diffusion layer, and the semiconductor device is a vertical NPN bipolar transistor.

* * * * *